(12) United States Patent
Feng et al.

(10) Patent No.: US 7,645,393 B2
(45) Date of Patent: Jan. 12, 2010

(54) METAL SURFACE TREATMENT COMPOSITION

(76) Inventors: Kesheng Feng, 269 Spruce St., Cheshire, CT (US) 06410; Ming De Wang, 233 Donovan Rd., Naugatuck, CT (US) 06770; Steven A. Castaldi, 134 Farmstead La., Torrington, CT (US) 06790

( * ) Notice: Subject to any disclaimer, the term of this patent is extended or adjusted under 35 U.S.C. 154(b) by 374 days.

(21) Appl. No.: 11/796,660

(22) Filed: Apr. 27, 2007

(65) Prior Publication Data

US 2008/0264900 A1    Oct. 30, 2008

(51) Int. Cl.
C25F 3/00    (2006.01)
C03C 15/00   (2006.01)
C03C 25/68   (2006.01)
C08K 5/16    (2006.01)
C09K 13/04   (2006.01)

(52) U.S. Cl. .................. 216/106; 524/206; 252/79.2
(58) Field of Classification Search .............. 524/300, 524/206; 216/106; 252/79.2
See application file for complete search history.

(56) References Cited

U.S. PATENT DOCUMENTS

| 2,302,332 | A |   | 11/1942 | Leekley |
|---|---|---|---|---|
| 3,425,855 | A |   | 2/1969 | Barksdale et al. |
| 4,466,859 | A | * | 8/1984 | Nelson ................. 216/78 |
| 5,869,130 | A |   | 2/1999 | Ferrier |
| 5,965,036 | A |   | 10/1999 | Maki et al. |
| 6,113,771 | A |   | 9/2000 | Landau et al. |
| 6,146,701 | A |   | 11/2000 | Ferrier |
| 6,506,314 | B1 |   | 1/2003 | Whitney, Jr. et al. |
| 6,746,547 | B2 |   | 6/2004 | Cole et al. |

\* cited by examiner

*Primary Examiner*—Mark Eashoo
*Assistant Examiner*—Angela C Scott
(74) *Attorney, Agent, or Firm*—Carmody & Torrance LLP

(57) ABSTRACT

A process is described for treating metal surfaces with roughening compositions that use poly(ethyleneamino propionitrile) polymer as an additive in the composition to improve adhesion of polymeric materials to the metal surfaces and to improve peel strength for thermal stability. The polymer of the invention may be added to compositions containing for example, cupric chloride and hydrochloric acid and is also usable in compositions containing an oxidizer/acid/azole mixture. Other additives, such as adiponitrile may also be beneficially added to compositions of the invention.

47 Claims, 2 Drawing Sheets

The Acrylonitrile-ethylation of Poly(ethylenimine) :

METAL SURFACE TREATMENT COMPOSITION

FIELD OF THE INVENTION

The present invention relates to compositions useful for treating metal surfaces such as copper and copper alloys to roughen the surface for subsequent adhesion of the metal surface to a polymeric material.

BACKGROUND OF THE INVENTION

Printed circuits containing one or more circuitry innerlayers are in prominent use today as demand increases for weight and space conservation in electronic devices.

In the typical fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, the desired copper circuitry pattern remains thereon.

A composite of alternating circuitry inner layers and dielectric substrate materials is formed by interposing one or more partially-cured dielectric substrate material layers (so-called "pre-preg" layers) between the circuitry innerlayers. The composite is then subjected to heat and pressure to cure the partially-cured substrate material and achieve bonding of circuitry innerlayers. The cured composite may then have through-holes drilled therethrough, which are metallized to provide a means for conductively interconnecting all of the circuitry layers. In the course of the through-hole metallizing process, desired circuitry patterns may also be formed on the outer-facing layers of the multilayer composite.

It has long been known that the strength of the adhesive bond formed between the copper metal of the circuitry innerlayers and the cured pre-preg layers, or other non-conductive coatings, in contact therewith leaves something to be desired, with the result that the cured multi-layer composite or the coating is susceptible to delamination in subsequent processing and/or use. In response to this problem, the industry has developed the technique of forming on the copper surfaces of the circuitry innerlayers (before assembling them with pre-preg layers into a multi-layer composite) a layer of copper oxide, such as by chemical oxidation of the copper surfaces. Various approaches have been proposed for minimizing the delamination problems, some of which are described in U.S. Pat. No. 6,146,701 to Ferrier, the subject matter of which is herein incorporated by reference in its entirety.

In addition, other efforts for treating metal surfaces have utilized a so-called microetching composition, as described for example in U.S. Pat. No. 5,965,036 to Maki et al., the subject matter of which is herein incorporated by reference in its entirety. In this instance, the microetching agent comprising a small amount of a polymer compound which contains polyamine chains or a cationic group, or both, to produce a deep irregularly etched surface on the surface of copper or a copper alloy surface.

The present invention proposes a novel polymer formed from a reaction product of polyethylenimine and acrylonitrile and is usable in different compositions to improve the adhesion of polymeric materials to metal surfaces, especially copper and copper alloy surfaces during the manufacture of multi-layer printed circuit boards. Thus, the process of the invention is particularly useful in the production of multi-layer printed circuits. The process proposed herein provides optimum adhesion between the metallic and polymeric surfaces (i.e., the circuitry and the intermediate insulating layer).

The inventors of the present invention have determined that poly(ethyleneamino propionitrile) polymer, which is a reaction product comprised of polyethylenimine and acrylonitrile can beneficially be added to compositions used for roughening metal surfaces and provide improved adhesion of the metal surface to a polymeric substrate as compared with compositions of the prior art.

SUMMARY OF THE INVENTION

It is an object of the present invention to provide compositions capable of roughening metal surfaces to increase the adhesion of a polymeric material to the metal surface.

It is another object of the present invention to provide an improved polymer additive for inclusion in a roughening composition.

To that end, the present invention relates to a composition for and a method of increasing the adhesion of a polymeric material to a metal surface, the method comprising the steps of:

a) contacting the metal surface with a composition comprising:
  i) an oxidizer comprising a source of cupric ions;
  ii) at least one of an organic acid or an inorganic acid;
  iii) a source of halide ions; and
  iv) poly(ethyleneamino propionitrile) polymer; and b) thereafter, bonding a polymeric material to the metal surface.

In another embodiment, the present invention relates to a different composition for and method of increasing the adhesion of a polymeric material to a metal surface, the method comprising the steps of:

a) contacting the metal surface with a composition comprising:
  i) an oxidizer;
  ii) at least one acid;

iii) a corrosion inhibitor;

iv) poly(ethyleneamino propionitrile) polymer;

v) optionally, a source of halide ions; and b) thereafter, bonding a polymeric material to the metal surface.

The inventors have found that the addition of the novel polymer of the invention to various roughening compositions improves the adhesion of metal surfaces to polymeric materials in the manufacture of printed circuit boards and allows for better control of characteristics of the metal surface.

Other objects, features and advantages of the invention will hereinafter become more readily apparent from the following description.

DETAILED DESCRIPTION OF THE INVENTION

The present invention relates to an improved polymer for use in adhesion promoting and microetching compositions to improve the adhesion of metal surfaces to polymeric substrates. The proposed process is usable for example in manufacturing multilayer printed circuit boards, and the metal circuitry (usually copper) of the innerlayers is treated with the adhesion-promoting composition or microetching composition. After treatment, followed by water rinsing, the innerlayers are bonded together with polymeric materials such as pre-pregs or imageable dielectrics, resulting in a multi layer printed circuit board.

The metal surface to be treated may comprise a variety of metals such as copper, copper alloys, nickel and iron. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

Figure 1:
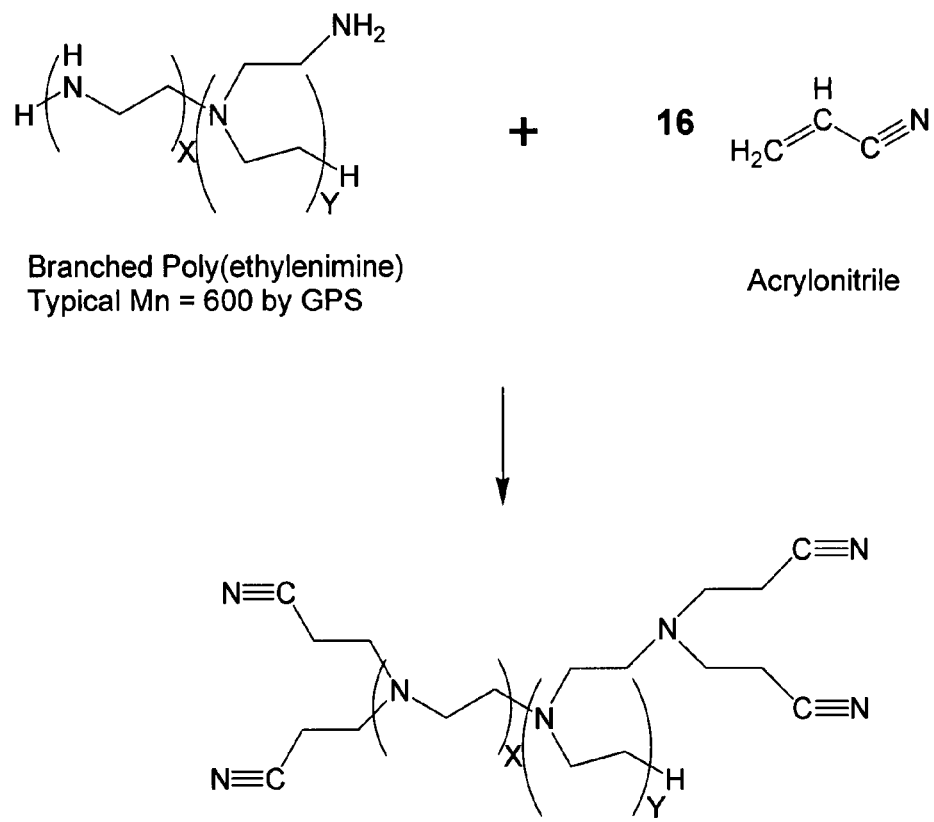
FIG. 1 depicts a proposed synthesis for the poly(ethyleneamino propionitrile) polymer of the invention.

An example of the synthesis of the poly(ethyleneamino propionitrile) polymer of the invention is set forth in FIG. 1, which shows the reaction of a branched polyethylenimine having a Mn of about 600 with acrylonitrile to yield the poly(ethyleneamino propionitrile) polymer prepared in accordance with the present invention.

The inventors of the present invention have determined that the poly(ethyleneamino propionitrile) polymer may be used as an additive in various types of roughening compositions for copper and copper alloy surfaces, which may include compositions based on copper chloride, such as compositions described for example in U.S. Pat. No. 5,965,036 to Maki et al., the subject matter of which is herein incorporated by reference in its entirety, and compositions based on an oxidizer/acid/azole, as described for example in U.S. Pat. No. 6,146,701 to Ferrier, the subject matter of which is herein incorporated by reference in its entirety.

In one embodiment, the present invention relates to a method of increasing the adhesion of a polymeric material to a metal surface, the method comprising the steps of:

a) contacting the metal surface with a composition comprising:

i) an oxidizer comprising a source of cupric ions;

ii) at least one of an organic acid or an inorganic acid;

iii) a source of halide ions; and iv) poly(ethyleneamino propionitrile) polymer; and b) thereafter, bonding a polymeric material to the metal surface.

Examples of the cupric ion source compounds include a cupric salt of an organic acid, cupric chloride, cupric bromide, cupric hydroxide and combinations of one or more of the foregoing. In a preferred embodiment, the cupric ion source is cupric chloride. The concentration of the cupric ion source compound in the composition is typically about 0.01 to 20% by weight, based on the amount of metallic copper. If the amount is too little, etching of the metal surface is slowed. If the amount is too great, it becomes difficult to dissolve the cupric ion source compounds in the solution, resulting in the production of smudges on the treated copper surface.

Examples of the organic acid used in this microetching agent include saturated aliphatic acids, such as formic acid, acetic acid, propionic acid, butyric acid, valeric acid, and caproic acid; unsaturated aliphatic acids, such as acrylic acid, crotonic acid, and iso-crotonic acid; saturated aliphatic dicarboxylic acids, such as oxalic acid, malonic acid, succinic acid, glutaric acid, adipic acid, and pimelic acid; unsaturated aliphatic dicarboxylic acids such as maleic acid; aromatic carboxylic acids, such as benzoic acid, phthalic acid, and cinnamic acid; hydroxyl carboxylic acids, such as glycolic acid, lactic acid, malic acid, and citric acid; carboxylic acids with substituents, such as sulfamic acid, beta-chloropropionic acid, nicotinic acid, ascorbic acid, hydroxyl pivalic acid, and levulinic acid; as well as their derivatives. As examples of the inorganic acids, hydrochloric acid, sulfuric acid, nitric acid, and phosphoric acid are given. Two or more these organic or inorganic acids may be used together.

The amount of the organic acids or inorganic acids is preferably in the range of 0.1-30%. If this amount is too small, the composition cannot sufficiently dissolve copper oxide and may produce smudges on the treated surfaces. In addition, it is difficult to achieve a stable etching speed. If the amount of the organic acids or inorganic acids is too great, the solution stability of the copper is lowered. Re-oxidation may occur on the surface of the copper.

Halide ions used in this preferred embodiment include chloride ion, bromide ion, and the like. The halide ions are added as a compound which can be dissociated into a halide ion in solution, such as hydrochloric acid, hydrobromic acid, sodium chloride, calcium chloride, potassium chloride, ammonium chloride, potassium bromide, copper chloride, zinc chloride, iron chloride, iron bromide, tin bromide, copper bromide, and combinations of one or more of the foregoing. Cupric chloride, for example, can be used as a compound functioning as both the cupric ion source compound and the halide ion source compound.

The amount of halide ion in the composition of this embodiment is preferably in the range of 0.01-20%. If too small, it is difficult to obtain copper surfaces with excellent adhesion to resins and superior solderability. If the amount of the halide ion is too large, not only is it difficult to produce a copper surface with excellent adhesive properties and solderability, but also the solubility of copper in the solution is unstable.

The poly(ethyleneamino propionitrile) polymer of the invention is typically used in the composition at a concentration of about 0.01 to 1.0 grams/liter, more preferably about 0.15 to about 0.70 g/l.

In another embodiment, the composition of the invention may include a ferric ion source compound as the oxidizing agent, an organic or inorganic acid, a halide ion source, and the novel poly(ethyleneamino propionitrile) polymer.

Given as examples of the ferric ion source compounds are iron (III) chloride, iron (III) bromide, iron (III) iodide, iron (III) sulfate, iron (III) nitrate, and iron (III) acetate. Two or more ferric ion source compounds may be used together. The content of the ferric ion source compounds in the composition of this embodiment in terms of the amount of metallic iron is 0.01 to 20% by weight. The etching is slow if this amount is too small. If the amount is too great, it is difficult to dissolve the cupric ion source compounds in the solution, resulting in the production of smudges on the treated copper surface.

The composition of the invention may also include other additives, such as adiponitrile, which is usable at a concentration between about 0.0.1 and 1.0 ml/l, more preferably at a concentration between about 0.3 and 0.8 ml/l.

If desirable, the roughened metal surfaces of the invention can be further be contacted with a post dip composition. One suitable post dip composition comprises a 10% hydrochloric acid solution.

The following examples are illustrative of the invention but should not be taken as limiting:

EXAMPLES

A roughening composition comprising a solution of cupric chloride and hydrochloric acid was prepared with different concentrations of the poly(ethyleneamino propionitrile) polymer (set forth in Table 1) of the invention as follows:

150 ml/l cupric chloride 10 ml/l hydrochloric acid (36%)

Samples 10 and 11 also contained 0.5 ml/l of adiponitrile.

Acid plated panels were used and the bath temperature was maintained at about 40° C. As set forth below in Table 1, most of the samples were immersed in the composition of the invention for 60 seconds and were then post-dipped in a solution of 10% hydrochloric acid for 30 seconds. In the alternative, for samples 6, 8 and 11, instead of immersing the panels in the roughening composition, the panels were spray treated with the composition. The results are set forth below in Table 1.

TABLE 1

| Sample # | Polymer Concentration (g/l) | Contacting means | Surface Appearance | Etching Rate (μinch) |
|---|---|---|---|---|
| 1 | 0.00 | Immersion, 60 sec. | Semi-shining | 54.2 |
| 2 | 0.025 | Immersion, 60 sec. | Semi-shining | 55.4 |
| 3 | 0.075 | Immersion, 60 sec. | Slight matte | 47.5 |
| 4 | 0.175 | Immersion, 60 sec. | Matte | 45.5 |
| 5 | 0.275 | Immersion, 60 sec. | Matte | 49.4 |
| 6 | 0.275 | Spraying, 45 sec. | Shining | 59.2 |
| 7 | 0.375 | Immersion, 60 sec. | Slight matte, non-uniform | 57.5 |
| 8 | 0.475 | Spraying, 45 sec. | Matte, non-uniform | 58.2 |
| 9 | 0.575 | Immersion, 60 sec. | Matte, non-uniform | 60.6 |
| 10 | 0.675 | Immersion, 60 sec. | Slight matte | 52.8 |
| 11 | 0.675 | Spraying, 45 sec. | Slight matte | 52.8 |

Figure 2:
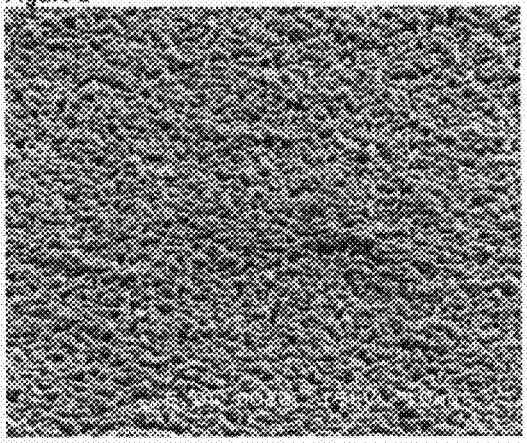
FIG. 2 depicts a scanning electron microscope (SEM) image of a metal surface that has been roughened with a composition that does not contain the poly(ethyleneamino propionitrile) polymer of the invention.

As set forth in Table 1, without any poly(ethyleneamino propionitrile) polymer in the composition, a semi-shining surface is obtained and a scanning electron microscope (SEM) image of the surface showed a slight roughened surface, as seen in FIG. 2.

Figure 3:
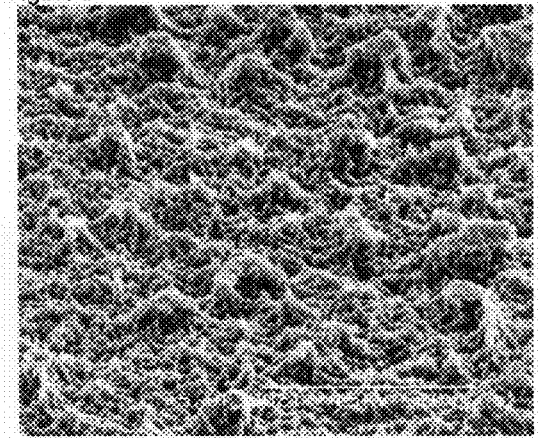
FIG. 3 depicts a SEM image of a metal surface that has been roughened with a composition that contains 0.175 g/l of the poly(ethyleneamino propionitrile) polymer and is treated by immersion.
Figure 4:
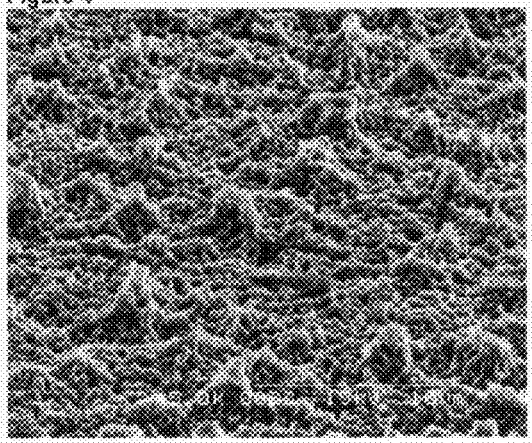
FIG. 4 depicts a SEM image of a metal surface that has been roughened with a composition that contains 0.275 g/l of the poly(ethyleneamino propionitrile) polymer and is treated by immersion.
Figure 5:
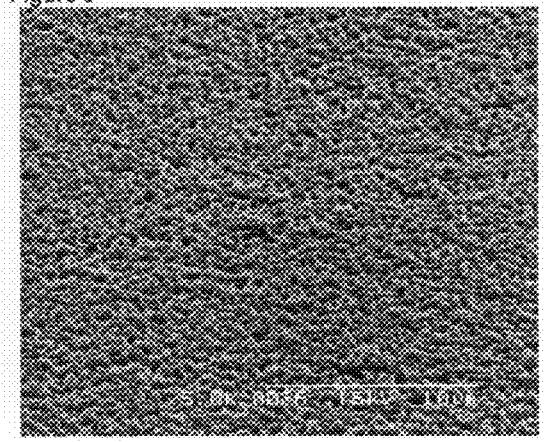
FIG. 5 depicts a SEM image of a metal surface that has been roughened with a composition that contains 0.275 g/l of the poly(ethyleneamino propionitrile) polymer and is treated by spraying.

After the poly(ethyleneamino propionitrile) polymer was added into the composition, at a concentration of 0.175 g/l to 0.275 g/l (samples 4 and 5), the immersion treated surface gradually became matte. However, when the surface was processed by spraying (sample 6), the surface was instead shining. SEM images of samples 4, 5 and 6 are set forth in FIGS. 3, 4 and 5 respectively.

Figure 6:
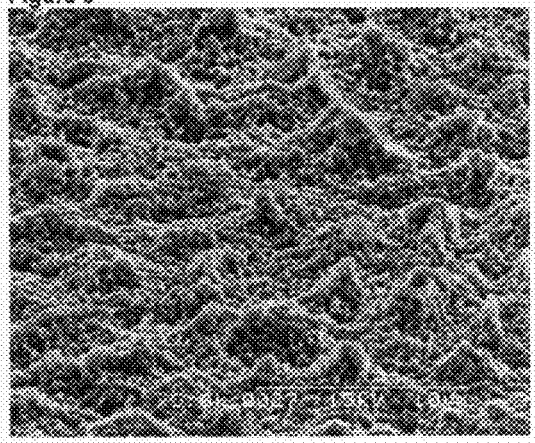
FIG. 6 depicts a SEM image of a metal surface that has been roughened with a composition that contains 0.475 g/l of the poly(ethyleneamino propionitrile) polymer and is treated by spraying.

When the poly(ethyleneamino propionitrile) polymer concentration was above 0.275 g/l in the composition, the surface became semi-matte when processed by immersion and because matte, but not uniform, when processed by spraying (Example 8). A SEM image of this sample is set forth in FIG. 6.

Figure 7:
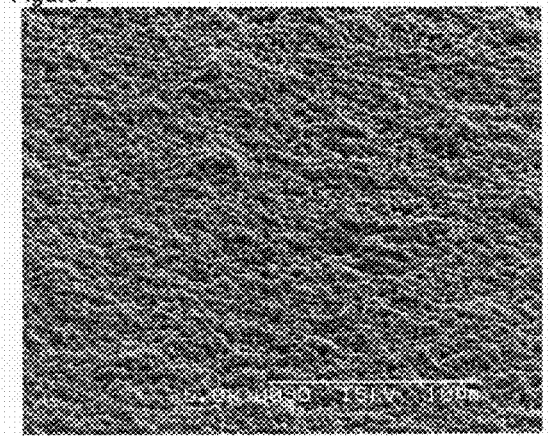
FIG. 7 depicts a SEM image of a metal surface that has been roughened with a composition that contains 0.675 g/l of the poly(ethyleneamino propionitrile) polymer and 0.5 ml/l of adiponitrile and is treated by spray.

After 0.5 ml/l of adiponitrile was further added to the composition, the surface became less rough as shown by the SEM image of sample 11, as set forth in FIG. 7.

The poly(ethyleneamino propionitrile) polymer in the composition has the function to roughen the copper surface and gives uniform and rough surface by immersion with low concentration while it gives rough, but non-uniform surface by spraying at a higher concentration. The surface also has less roughness by the addition of the adiponitrile.

In another embodiment, the invention relates to a method of increasing the adhesion of a polymeric material to a metal surface, the method comprising the steps of:

a) contacting the metal surface with a composition comprising:
  i) an oxidizer;
  ii) at least one acid;
  iii) a corrosion inhibitor;
  iv) poly(ethyleneamino propionitrile) polymer;
  v) optionally, a source of halide ions; and
b) thereafter, bonding a polymeric material to the metal surface.

In this instance, the oxidizer may comprise any oxidizer which is capable of oxidizing the metal surface in the matrix of the composition. However, the inventors have found hydrogen peroxide and persulfates to be particularly preferred oxidizers, with hydrogen peroxide being the most preferred oxidizer. The concentration of the oxidizer in the composition may typically range from 6 to 60 grams per liter but is preferably from 12 to 30 grams per liter.

The acid utilized in the composition may be any acid which is stable in the matrix. However, the inventors have found mineral acids to be particularly preferred, and more particularly sulfuric acid is especially preferred. The concentration of the acid in the composition may typically range from about 5 to 360 grams per liter, preferably from about 70 to 110 grams per liter.

The poly(ethylenimine acrylonitrile) polymer of the invention is typically used in the composition at a concentration of about 0.01 to 1.0 grams/liter, more preferably about 0.15 to about 0.70 g/l.

The corrosion inhibitor used in the composition is a compound which effectively reacts with the metal surface to form a protective complex layer. Preferred corrosion inhibitors are selected from the group consisting of triazoles, benzotriazoles, tetrazoles, imidazoles, benzimidazoles and mixtures of one of more of the foregoing. The concentration of the corrosion inhibitor in the composition may range from about 1 to 20 grams per liter but is preferably from 6 to 12 grams per liter.

If used, the source of halide ions may be any compound which would provide halide ions in the matrix of the composition. Preferably, the source of halide ions are alkaline metal salts such as sodium chloride or potassium chloride, oxohalides such as sodium chlorate or potassium chlorate, or halide bearing mineral acids such as hydrochloric acid. Preferably the source of halide ions provides chloride ions to the composition or the source of halide ions provides chlorate ions to the composition. The concentration of the source of halide ions in the composition may range from about 5 to 500 milligrams per liter but is preferably from about 10 to 50 milligrams per liter, all based on halide ion content.

In one embodiment, the composition of the invention may contain a source of adhesion enhancing ions. If used, the source of adhesion enhancing ions can be any material which will supply ions selected from the group consisting of molybdates, tungstates, tantalates, niobates, vanadates and mixtures thereof to the composition. Such sources include alkali metal salts molybdates, tungstate, tantalates, niobates, vanadates and mixtures thereof such as sodium (or potassium) molybdate, tungstate, niobate or vanadate. Preferred sources include iso and hetero polyacids of molylodenum, tungsten, niobium, vanadium and mixtures thereof such as molybdic acid, vanadic acid and tungsten acid. The most preferred source of adhesion enhancing ions is molybdic acid. If used, the concentration of adhesion enhancing ions in the composition may range from about 1 mg/l to 500 mg/l (based on the adhesion enhancing ion content) but is preferably from 5 mg/ to 200 mg/l.

Other additives that may be used in the composition of the invention include adiponitrile, which may be used at a concentration between about 0.1 and 1.0 ml/l, more preferably at a concentration between about 0.3 and 0.8 ml/l.

The inventors of the present invention have determined that use of the poly(ethyleneamino propionitrile) polymer in the composition shows improved peel strength for thermal stability.

The metal surfaces can be treated with the compositions of the invention in a variety of ways, including immersion, spray, or flood. The temperature of the composition during treatment is not critical and may range from about 80° F. to about 150° F. but is preferably from about 90° F. to about 120° F. The treatment time will vary depending upon the temperature and method of treatment but may range from 15 seconds to 15 minutes and is preferably from 1 to 2 minutes. For example, in one embodiment, the metal surface is contacted with a composition of the invention by immersion, typically for at least 60 seconds or more. In another embodiment, the metal surface is contacted with the composition by spraying, typically for at least about 45 seconds. The inventors have found that the desired finish on the metal surface may be controlled by using different means of contacting the composition with the surface. For example, immersing the metal surface in the composition provides different coating characteristics on the surface than spraying the metal surfaces with the composition.

In addition, various polymeric materials may be bonded to the prepared metal surfaces, such as resists and prepreg materials, which are given by way of example and not limitation.

It can thus be seen that the present invention is advantageous in that it provides an improved composition for roughening a metal surface, especially copper and copper alloy surfaces during the manufacture of multi-layered printing circuit boards. Additionally, as disclosed herein, it can be seen that the novel polymer of the invention can be used with different types of roughening compositions to provide a desirable result.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It should also be understood that the following claims are intended to cover all of the generic and specific features of the invention described herein and all statements of the scope of the invention that as a matter of language might fall therebetween.

What is claimed is:

1. A method of increasing the adhesion of a polymeric material to a metal surface, the method comprising the steps of:
   a) contacting the metal surface with a composition comprising:
      i) an oxidizer comprising a source of cupric ions;
      ii) at least one of an organic acid or an inorganic acid;
      iii) a source of halide ions; and
      iv) poly(ethyleneamino propionitrile) polymer; and
   b) thereafter, bonding a polymeric material to the metal surface;
   wherein said metal surface comprises copper.

2. The method according to claim 1, wherein the source of cupric ions is selected from the group consisting of cupric chloride, cupric bromide, cupric hydroxide, cupric salts of organic acids and combinations of one or more of the foregoing.

3. The method according to claim 2, wherein the source of cupric ions is cupric chloride.

4. The method according to claim 1, wherein the source of halide ions is selected from the group consisting of hydrochloric acid, hydrobromic acid, sodium chloride, calcium chloride, potassium chloride, ammonium chloride, potassium bromide, copper chloride, zinc chloride, iron chloride, iron bromide, tin bromide, copper bromide, and combinations of one or more of the foregoing.

5. The method according to claim 4, wherein the source of halide ions comprises hydrochloric acid.

6. The method according to claim 1, wherein the concentration of the poly(ethyleneamino propionitrile) polymer in the composition ranges from about 0.01 to 1.0 grams/liter.

7. The method according to claim 6, wherein the concentration of the poly(ethyleneamino propionitrile) polymer in the composition ranges from about 0.15 to about 0.70 g/l.

8. The method according to claim 1, wherein the composition further comprises adiponitrile.

9. The method according to claim 8, wherein the concentration of adiponitrile is between about 0.1 and 1.0 mill.

10. The method according to claim 1, wherein the metal surface is contacted with the composition by immersion or by spraying.

11. A roughening composition for increasing the adhesion of a polymeric material to a metal surface, the composition comprising:
   a) an oxidizer comprising a source of cupric ions;
   b) at least one of an organic acid or an inorganic acid;
   c) a source of halide ions; and
   d) poly(ethyleneamino propionitrile) polymer;
   wherein said metal surface comprises copper.

12. The roughening composition according to claim 11, wherein the source of cupric ions is selected from the group consisting of cupric chloride, cupric bromide, cupric hydroxide, cupric salts of organic acids and combinations of one or more of the foregoing.

13. The roughening composition according to claim 12, wherein the source of cupric ions is cupric chloride.

14. The roughening composition according to claim 11, wherein the source of halide ions is selected from the group consisting of hydrochloric acid, hydrobromic acid, sodium chloride, calcium chloride, potassium chloride, ammonium chloride, potassium bromide, copper chloride, zinc chloride, iron chloride, iron bromide, tin bromide, copper bromide, and combinations of one or more of the foregoing.

15. The roughening composition according to claim 14, wherein the source of halide ions comprises hydrochloric acid.

16. The roughening composition according to claim 11, wherein the concentration of the poly(ethyleneamino propionitrile) polymer in the composition ranges from about 0.01 to 1.0 grams/liter.

17. The roughening composition according to claim 16, wherein the concentration of the poly(ethyleneamino propionitrile) polymer in the composition ranges from about 0.15 to about 0.70 g/l.

18. The roughening composition according to claim 11, wherein the composition further comprises adiponitrile.

19. The roughening composition according to claim 18, wherein the concentration of adiponitrile is between about 0.1 and 1.0 ml/l.

20. A method of increasing the adhesion of a polymeric material to a metal surface, the method comprising the steps of:
   a) contacting the metal surface with a composition comprising:
      i) an oxidizer;
      ii) at least one acid;
      iii) a corrosion inhibitor;
      iv) poly(ethyleneamino propionitrile) polymer;
      v) optionally, a source of halide ions; and
   b) thereafter, bonding a polymeric material to the metal surface;
   wherein said metal surface comprises copper.

21. The method according to claim 20, wherein the oxidizer is selected from the group consisting of hydrogen peroxide and persulfates.

22. The method according to claim 21, wherein the oxidizer is hydrogen peroxide.

23. The method according to claim 20, wherein the corrosion inhibitor is selected from the group consisting of triazoles, benzotriazoles, imidazoles, benzimidazoles, tetrazoles, and mixtures of one or more of the foregoing.

24. The method according to claim 20, wherein the composition further comprises a source of adhesion enhancing ions, which ions are selected from the group consisting of molybdates, tungstates, tantalates, niobates, vanadates, and mixtures of one or more of the foregoing.

25. The method according to claim 24, wherein the source of adhesion enhancing ions comprise molybdate ions.

26. The method according to claim 20, wherein the at least one acid is a mineral acid.

27. The method according to claim 20, wherein the source of halide ions is selected from the group consisting of alkaline metal halide salts and oxohalide salts.

28. The method according to claim 20, wherein the source of halide ions is a source of chloride ions.

29. The method according to claim 20, wherein the concentration of the poly(ethyleneamino propionitrile) polymer in the composition ranges from about 0.01 to 1.0 grams/liter.

30. The roughening composition according to claim 29, wherein the concentration of the poly(ethyleneamino propionitrile) polymer in the composition ranges from about 0.15 to about 0.70 g/l.

31. The method according to claim 20, wherein the composition further comprises adiponitrile.

32. The method according to claim 31, wherein the concentration of adiponitrile is between about 0.1 and 1.0 ml/l.

33. The method according to claim 20, wherein the metal surface is contacted with the composition by immersion or by spraying.

34. The method according to claim 20, wherein the polymeric material is a resist or a prepreg.

35. A roughening composition for increasing the adhesion of a polymeric material to a metal surface, the composition comprising:
   a) an oxidizer;
   b) at least one acid;
   c) a corrosion inhibitor;
   d) a polymer comprising a reaction product of polyethylenimine and acrylonitrile; and
   e) optionally, a source of halide ions;
   wherein said metal surface comprises copper.

36. The roughening composition according to claim 35, wherein the oxidizer is selected from the group consisting of hydrogen peroxide and persulfates.

37. The roughening composition according to claim 36, wherein the oxidizer is hydrogen peroxide.

38. The roughening composition according to claim 35, wherein the corrosion inhibitor is selected from the group consisting of triazoles, benzotriazoles, imidazoles, benzimidazoles, tetrazoles, and mixtures of one or more of the foregoing.

39. The roughening composition according to claim 35, wherein the composition further comprises a source of adhesion enhancing ions, which ions are selected from the group consisting of molybdates, tungstates, tantalates, niobates, vanadates, and mixtures of one or more of the foregoing.

40. The roughening composition according to claim 39, wherein the source of adhesion enhancing ions comprise molybdate ions.

41. The roughening composition according to claim 35, wherein the at least one acid is a mineral acid.

42. The roughening composition according to claim 35, wherein the source of halide ions is selected from the group consisting of alkaline metal halide salts and oxohalide salts.

43. The roughening composition according to claim 35, wherein the source of halide ions is a source of chloride ions.

44. The roughening composition according to claim 35, wherein the concentration of the poly(ethyleneamino propionitrile) polymer in the composition ranges from about 0.01 to 1.0 grams/liter.

45. The roughening composition according to claim 44, wherein the concentration of the poly(ethyleneamino propionitrile) polymer in the composition ranges from about 0.15 to about 0.70 g/l.

46. The roughening composition according to claim 35, wherein the composition further comprises adiponitrile.

47. The roughening composition according to claim 46, wherein the concentration of adiponitrile is between about 0.1 and 1.0 mill.

* * * * *

UNITED STATES PATENT AND TRADEMARK OFFICE
CERTIFICATE OF CORRECTION

PATENT NO. : 7,645,393 B2  Page 1 of 1
APPLICATION NO. : 11/796660
DATED : January 12, 2010
INVENTOR(S) : Kesheng Feng et al.

It is certified that error appears in the above-identified patent and that said Letters Patent is hereby corrected as shown below:

Column 8

Line 39, delete "1.0 mill." and replace it with --1.0 ml/l--

Column 10

Line 56, delete "1.0 mill." and replace it with --1.0 ml/l--

Signed and Sealed this

Twenty-third Day of February, 2010

David J. Kappos
*Director of the United States Patent and Trademark Office*